United States Patent
Chen et al.

(10) Patent No.: US 7,755,897 B2
(45) Date of Patent: Jul. 13, 2010

(54) MEMORY MODULE ASSEMBLY WITH HEAT DISSIPATION DEVICE

(75) Inventors: Fei Chen, Shenzhen (CN); Di-Qiong Zhao, Shenzhen (CN); Yi-Chyng Fang, Taipei Hsien (TW); Yue-Bin Wang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 251 days.

(21) Appl. No.: 11/964,896

(22) Filed: Dec. 27, 2007

(65) Prior Publication Data

US 2009/0168356 A1  Jul. 2, 2009

(51) Int. Cl.
*H05K 7/20* (2006.01)
*H01L 23/36* (2006.01)

(52) U.S. Cl. ............... 361/707; 361/709; 361/715; 361/719; 361/728; 361/737; 257/709; 257/719

(58) Field of Classification Search .......... 361/709, 361/707, 715, 719, 728, 737; 257/709, 719
See application file for complete search history.

(56) References Cited

U.S. PATENT DOCUMENTS

| | | | | |
|---|---|---|---|---|
| 5,109,318 A * | 4/1992 | Funari et al. | ............. | 361/710 |
| 5,966,287 A * | 10/1999 | Lofland et al. | ........... | 361/704 |
| 6,119,765 A * | 9/2000 | Lee | ......... | 165/80.3 |
| 6,297,961 B1 * | 10/2001 | Koizumi et al. | ........ | 361/720 |
| 6,775,139 B2 * | 8/2004 | Hsueh | ..................... | 361/697 |
| 6,888,719 B1 * | 5/2005 | Janzen et al. | ........ | 361/679.31 |
| 7,079,396 B2 * | 7/2006 | Gates et al. | ............ | 361/719 |
| 7,106,595 B2 * | 9/2006 | Foster et al. | ............ | 361/721 |
| 7,333,338 B2 * | 2/2008 | Lai et al. | ................ | 361/715 |
| 7,345,882 B2 * | 3/2008 | Lee et al. | ................ | 361/710 |
| 7,349,219 B2 * | 3/2008 | Lai et al. | ................ | 361/719 |
| 7,349,220 B2 * | 3/2008 | Lai et al. | ................ | 361/719 |
| 7,375,964 B2 * | 5/2008 | Lai et al. | ................ | 361/704 |
| 7,443,023 B2 * | 10/2008 | Wehrly et al. | .......... | 257/707 |
| 7,457,122 B2 * | 11/2008 | Lai et al. | ................ | 361/704 |
| 2002/0039282 A1 * | 4/2002 | Han et al. | ............... | 361/719 |
| 2004/0130873 A1 * | 7/2004 | Hsueh | ................... | 361/697 |
| 2004/0250989 A1 * | 12/2004 | Im et al. | ............... | 165/80.1 |
| 2005/0141199 A1 * | 6/2005 | Chiou et al. | ........... | 361/704 |
| 2005/0201063 A1 * | 9/2005 | Lee et al. | ................ | 361/715 |
| 2006/0203454 A1 * | 9/2006 | Chang | ................. | 361/707 |
| 2006/0268523 A1 * | 11/2006 | Lin | ..................... | 361/710 |
| 2007/0195489 A1 * | 8/2007 | Lai et al. | ................ | 361/600 |

(Continued)

*Primary Examiner*—Anatoly Vortman
(74) *Attorney, Agent, or Firm*—Jeffrey T. Knapp

(57) ABSTRACT

A memory module assembly (100) includes a memory card (200) having a right side surface (240) and a left side surface (220), a heat sink (400) and a heat pipe (500). The heat sink includes a base member (420) attached to the left side surface of the memory card and a shell (440) attached to the right side surface of the memory card and coupled to the base member. The base member includes a substrate portion (422) attached to the left side surface of the memory card and a support portion (424) extended from the substrate portion and supported on a top edge of the memory card. The heat pipe includes an evaporator (520) in thermal engagement with one of the shell and the substrate portion and a condenser (540) in thermal engagement with the support portion.

20 Claims, 4 Drawing Sheets

U.S. PATENT DOCUMENTS

| | | |
|---|---|---|
| 2007/0223198 A1* | 9/2007 | Lai et al. .................... 361/720 |
| 2007/0263360 A1* | 11/2007 | Lai et al. .................... 361/719 |
| 2008/0013282 A1* | 1/2008 | Hoss et al. ................. 361/715 |
| 2008/0101036 A1* | 5/2008 | Chen .......................... 361/720 |
| 2009/0129026 A1* | 5/2009 | Baek et al. ................. 361/710 |
| 2009/0268408 A1* | 10/2009 | Liu et al. .................... 361/710 |

* cited by examiner

MEMORY MODULE ASSEMBLY WITH HEAT DISSIPATION DEVICE

BACKGROUND OF THE INVENTION

1. Field of the Invention

The present invention relates to a memory module assembly, and particularly to a memory module assembly with a heat dissipation device, which comprises a heat sink and a heat pipe for spreading heat of the memory module assembly on the heat sink.

2. Description of Related Art

The memory module assemblies that are currently in use generally do not require cooling devices to dissipate heat as they are operated on or below 66 MHz and do not generate enough heat to require a cooling device. However, as the industry progresses, memory module assemblies, such SDRAM DIMM memory module assemblies are now operating at 100 MHz or above. For these state-of-the-art memory module assemblies, heat sinks will be required to remove heat generated thereby.

However, since the memory module assemblies have small board areas and are usually mounted on an already crowded motherboard of a computer, the heat sinks mounted on the memory module assemblies are usually in form of a pair of flat sheet metal plates, which are mounted on opposite sides of memory cards of the memory module assemblies. Since the flat sheet metal plate has a smaller bulk volume with a small width due to the space limitation, heat produced by the memory cards can not be dissipated in time.

What is needed, therefore, is a memory module assembly with a heat dissipation device, which can dissipate heat of the memory module assembly in time.

SUMMARY OF THE INVENTION

In accordance with an embodiment of the present invention, a memory module assembly comprises a memory card having a right side surface and a left side surface, a heat sink and at least one heat pipe. The heat sink comprises a base member and a shell. The shell is attached to the right side surface of the memory card and coupled to the base member. The base member comprises a substrate portion attached to the left side surface of the memory card, and a support portion extended from the substrate portion and supported on a top edge of the memory card. The at least one heat pipe comprises an evaporator in thermal engagement with one of the shell and the substrate portion and a condenser in thermal engagement with the support portion.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
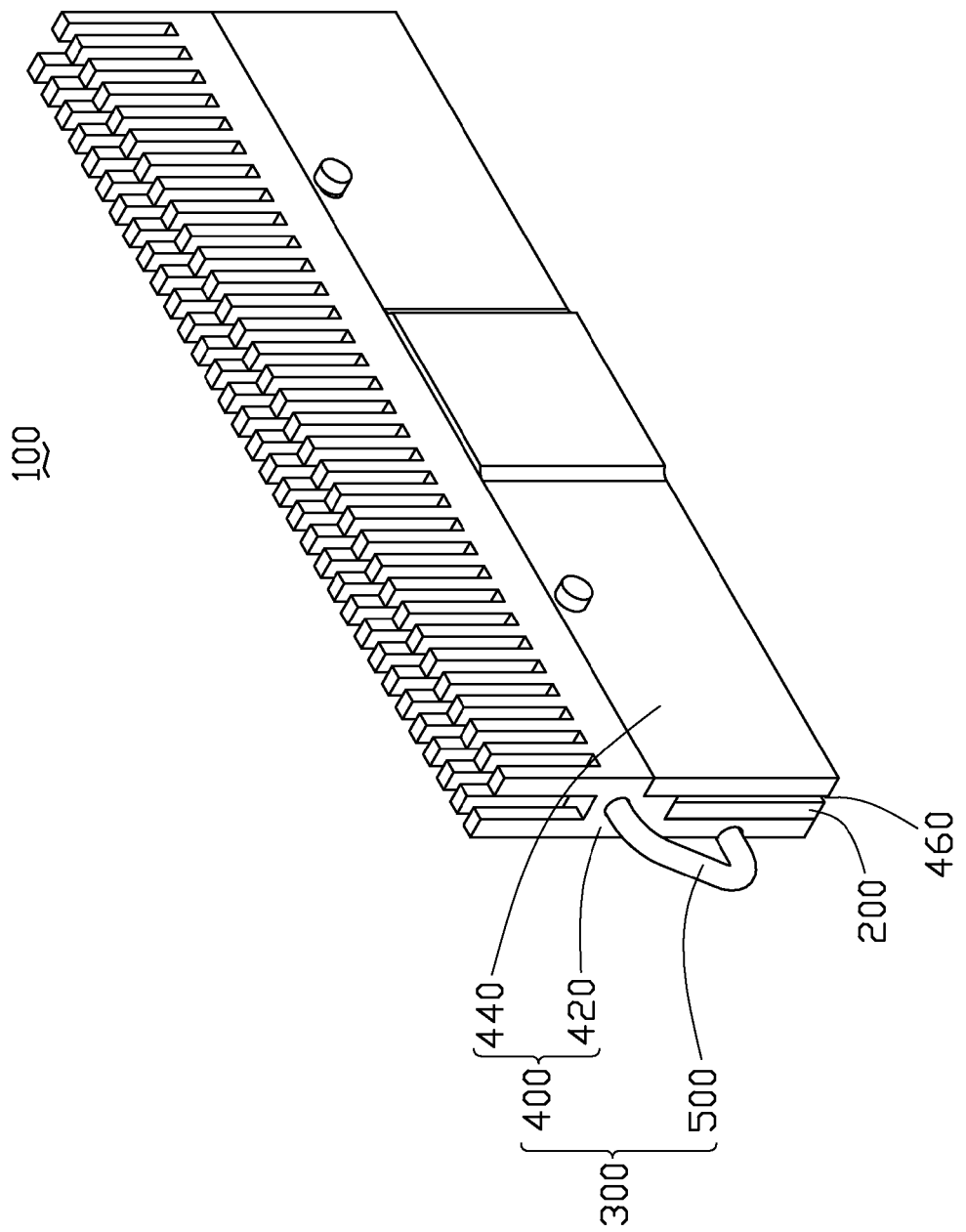
FIG. 1 is an assembled, isometric view of a memory module assembly in accordance with a preferred embodiment of the present invention.
Figure 2:
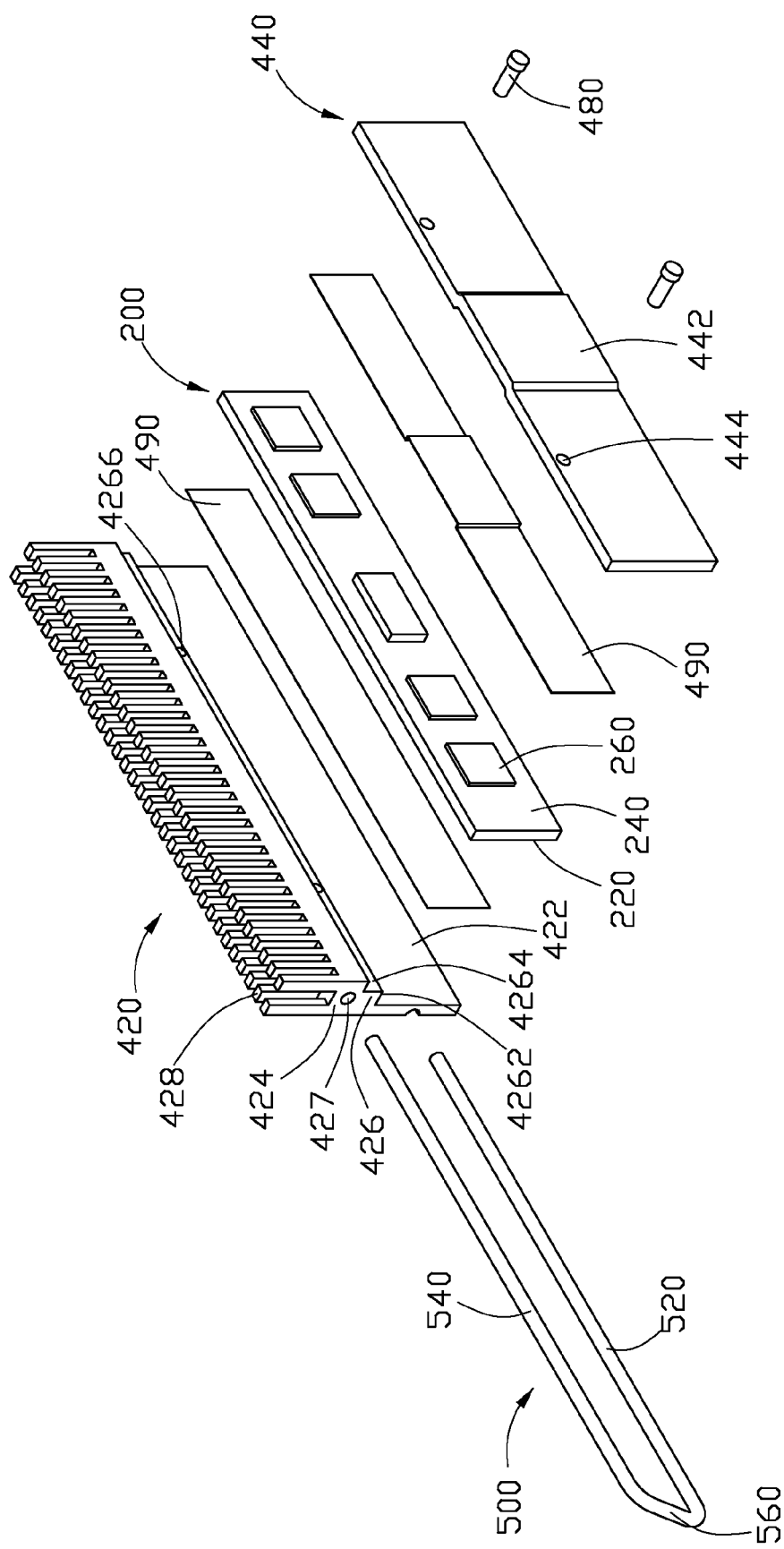
FIG. 2 is an exploded view of FIG. 1.
Figure 3:
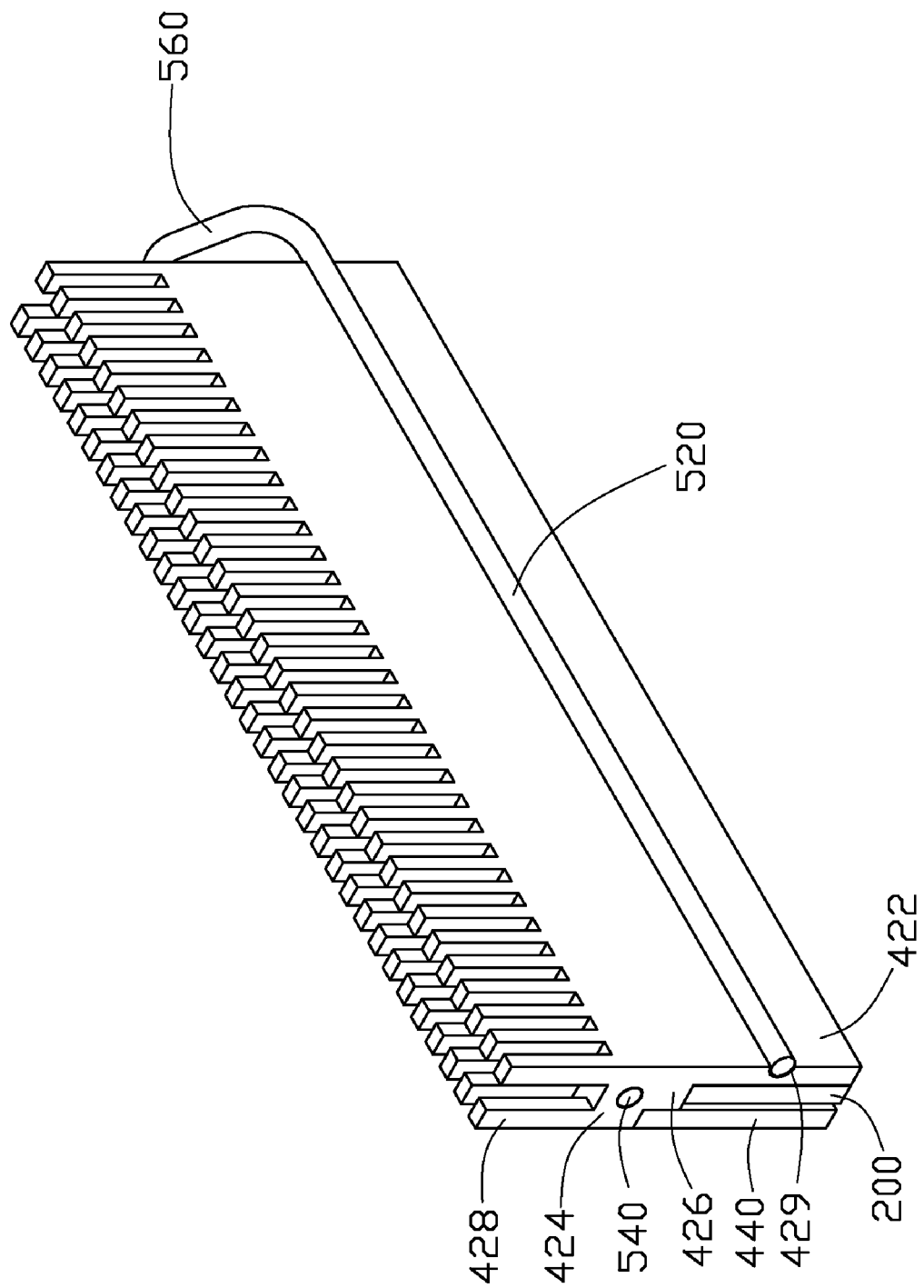
FIG. 3 is similar to FIG. 1, but viewed from another aspect.

Referring to FIGS. 1-3, a memory module assembly 100 of a preferred embodiment of the invention is illustrated. The memory module assembly 100 has a cuboid configuration, and comprises a memory card 200 and a heat dissipation device 300 mounted on the memory card 200.

The memory card 200 comprises a left side surface 220 and a right side surface 240. A plurality of memory chips 260 are mounted on the left side surface 220 and the right side surface 240 of the memory card 200, respectively. The memory card 200 is usually connected to a computer motherboard by means of a card edge connector (not shown), which is formed on a bottom edge of the memory card 200.

The heat dissipation device 300 comprises a heat sink 400. The heat sink 400 has a cuboid configuration, and comprises a base member 420 and a shell 440 detachably mounted on the base member 420. When the shell 440 is mounted on the base member 420, a gap 460 is defined between the base member 420 and the shell 440 to receive the memory card 200 therein. Heat produced by the memory card 200 is absorbed by the shell 440 and the base member 420, and then dissipated to ambient air. The detailed structure of the heat sink 400 will be described in the following text.

The base member 420 is formed by extrusion method, thus the base member 420 can be fabricated at a very low cost. The base member 420 has a substantially L-shaped profile when seen from an elevation side. The base member 420 comprises a substrate portion 422 and a support portion 424 integrally extended from a top edge of the substrate portion 422.

The support portion 424 extends from the substrate portion 422 and has a width larger than that of the substrate portion 422. A recess (not labeled) is defined in a bottom, right corner of the support portion 424, and a step portion 426 is therefore formed between the substrate portion 422 and the support portion 424. In other words, the step portion 426 is formed at a joint of the support portion 424 and the substrate portion 422. The step portion 426 has a width larger than that of the substrate portion 422, but smaller than that of the support portion 424. The step portion 426 comprises a bottom surface 4262 and a side surface 4264 perpendicular to the bottom surface 4262. The bottom surface 4262 of the step portion 426 is perpendicular to the left side surface 220 of the memory card 200. The side surface 4264 of the step portion 426 is parallel to the left side surface 220 of the memory card 200 and intersected with the bottom surface 4262 of the step portion 426.

The bottom surface 4262 of the step portion 426 serves to position the base member 420 on the memory card 200. The memory card 200 abuts against the bottom surface 4262 of the step portion 426 so that the base member 420 can be positioned in place on the memory card 200.

The side surface 4264 of the step portion 426 serves to mount the shell 440 on the support portion 424 of the base member 420. Two spaced screwed holes 4266 are defined in the side surface 4264 of the step portion 426. The screwed holes 4266 serve to mount the shell 440 to the base member 420.

The shell 440 is stamped and formed from a thin sheet metal, and comprises an outwardly extending shroud 442. By the presence of the shroud 442, the shell 440 can mate with the memory chips 260 of the memory card 200, which usually have different heights. Two spaced through holes 444 are defined in the shell 440 at opposite sides of the shroud 442 corresponding to the screwed holes 4266 of the base member 420. Two screws 480 are extended through the through holes 444 of the shell 440 and directly screwed into the screwed holes 4266 of the base member 420. As a result, the shell 440 is securely mounted on the step portion 426 with the memory card 200 firmly retained in the gap 460 defined between the shell 440 and the substrate portion 422. Heat produced by the memory card 200 can be conducted to the shell 440 and the substrate portion 422 along opposite directions. Then, heat at the substrate portion 422 is transferred to the support portion 424 to be dissipated to ambient air.

For accelerating heat dissipation of the memory card 200, a plurality of pin fins 428 extends upwardly from a top side of the support portion 424. The pin fins 428 are parallel to each other and extend upwardly along their axial directions. In other words, the pin fins 428 extend in a direction away from the memory card 200 and perpendicular to the bottom surface 4262 of the step portion 426. By such design, the heat sink 400 can have a large heat exchanging surface with a smaller width and can be applied in a computer, which provides a small space available for a memory module assembly. With the help of the pin fins 428, heat at the support portion 426 can be quickly dissipated.

For further accelerating heat dissipation of the memory card 200, a heat pipe 500 is provided in thermal engagement with the heat sink 400. The heat pipe 500 has a U-shaped configuration, comprises an evaporator 520, a condenser 540 and a connecting portion 560, which connects the evaporator 520 with the condenser 540. The condenser 540 is fittingly received in a channel 427, which is defined in a middle portion of the support portion 424 and extends along a longitudinal direction of the base member 420. The evaporator 520 is fittingly received in a channel 429, which is defined in a left side surface of the substrate portion 422 and extends along a longitudinal direction of the base member 420. In this embodiment, the evaporator 520 and the condenser 540 are installed in the base member 420 at different levels with the condenser 540 located at a higher level than the evaporator 520.

By the presence of the heat pipe 500, heat absorbed by the substrate portion 422 is quickly transferred to the support portion 424 via phase change of the heat pipe 500, then can be dissipated to ambient air via the fins 428.

As described above, the substrate portion 422 and the shell 440 are each in form of a sheet metal. Meanwhile, the fins 428 extend within a range defined by a right side surface of the shell 440 and the left side surface of the substrate portion 422. Therefore, the heat sink 400 has a small width but with a large heat exchanging surface.

Furthermore, the memory card 200 is received in the gap 460 defined in a lower portion of the heat sink 400 while the fins 428 are formed on an upper portion of the heat sink 400 and located above the memory card 200. At the same time, the heat pipe 500 has its condenser 540 and evaporator 520 positioned at the upper and lower portions, respectively. By such a design, heat produced by the memory card 200 can be quickly spread on the heat sink 400 via the heat pipe 500. As a result, the heat can be dissipated in time due to the large heat exchanging surface of the heat sink 400.

Additionally, for accelerating heat conduction between different components, an intermediate layer 490 formed of thermal conductive material, is provided between the shell 440 and the right side surface 240 of the memory card 200, and between the left side surface 220 of the memory card 200 and the substrate portion 422.

Figure 4:
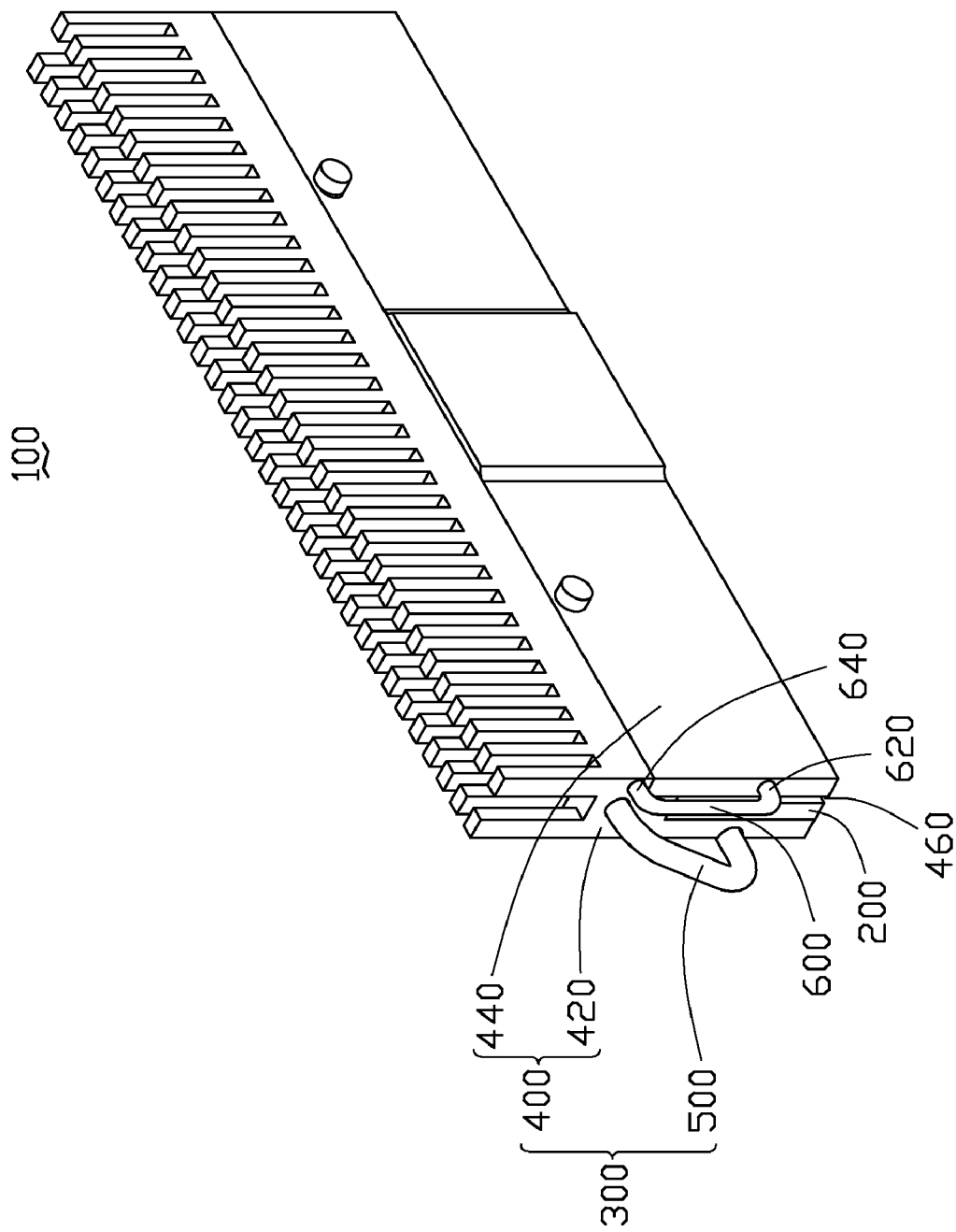
FIG. 4 is an assembled, isometric view of the memory module assembly of FIG. 1 together with another heat pipe.

As mentioned above, the memory module assembly 100 has one heat pipe 500. In another embodiment, there may be two or more heat pipes in thermal engagement with the heat sink 400. FIG. 4 illustrates an example, in which the memory module assembly 100 has two heat pipes 500, 600 in thermal engagement with the heat sink 400. Preferably, the heat pipe 500 contacts with the substrate portion 422 and the support portion 424, while the heat pipe 600 has its evaporator 620 in thermal contact with the shell 440 and its condenser 640 in thermal contact with the support portion 424. Therefore, heat accumulated at the shell 440 and the substrate portion 422 can be quickly transferred to the support portion 424 via the heat pipes 500, 600.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A memory module assembly comprising:
   a memory card having a right side surface and a left side surface;
   a heat sink comprising a base member and a shell, the shell attached to the right side surface of the memory card and coupled to the base member, the base member comprising a substrate portion attached to the left side surface of the memory card, and a support portion extended from the substrate portion and supported on a top edge of the memory card, wherein the substrate portion has a channel defined therein, and the support portion has a channel defined therein; and
   at least one heat pipe comprising an evaporator in thermal engagement with the substrate portion, and a condenser in thermal engagement with the support portion, wherein the condenser is received in the channel of the support portion, and the evaporator is received in the channel of the substrate portion.

2. The memory module assembly as described in claim 1, wherein the shell is detachably mounted on the support portion with a gap defined between the shell and the substrate portion, and the memory card is retained in the gap.

3. The memory module assembly as described in claim 2, wherein the gap is defined in a lower portion of the heat sink; and the base member further comprises a plurality of fins formed on the support portion on an upper portion of the heat sink.

4. The memory module assembly as described in claim 3, wherein the fins extend within a range defined by a right side surface of the shell and a left side surface of the base member.

5. The memory module assembly as described in claim 3, wherein the fins extend upwardly from the support portion.

6. The memory module assembly as described in claim 3, wherein the fins are in the form of pin fins.

7. The memory module assembly as described in claim 1, wherein the base member further comprises a step portion formed between the substrate portion and the support portion, and the step portion comprises a bottom surface abutting on the top edge of the memory card and a side surface, the shell being mounted on the side surface of the step portion.

8. The memory module assembly as described in claim 7, wherein the bottom surface of the step portion is perpendicular to the left side surface of the memory card; and the side surface of the step portion is parallel to the left side surface of the memory card and intersected with the bottom surface of the step portion.

9. The memory module assembly as described in claim 8, wherein two screw holes are defined in the side surface of the step portion, and two screws are extended through the shell and directly screwed into the screw holes of the step portion.

10. The memory module assembly as described in claim 1, wherein the substrate portion and the shell are each in the form of a sheet metal.

11. The memory module assembly as described in claim 1, further comprising two heat pipes, wherein one of the heat pipes has an evaporator in thermal engagement with the substrate portion and a condenser in thermal engagement with the support portion; and the other one of the heat pipes has an evaporator in thermal engagement with the shell and a condenser in thermal engagement with the support portion.

12. A memory module assembly comprising:
    a memory card having a right side surface and a left side surface; and
    a heat sink comprising:
        a base member comprising a substrate portion attached to the left side surface of the memory card, a support portion extending from the substrate portion and located above the memory card, and a step portion formed between the support portion and the substrate portion, the step portion comprising:
            a bottom surface abutting against a top edge of the memory card; and
            a side surface;
        a shell attached to the right side surface of the memory card and coupled to the support portion, wherein the side surface of the step portion of the base member supports the shell on the support portion; and
        a plurality of fins extending upwardly from the support portion.

13. The memory module assembly as described in claim 12, wherein the shell is detachably mounted on the side surface of the step portion and presses the memory card towards the substrate portion.

14. The memory module assembly as described in claim 12, further comprising a heat pipe connecting one of the shell and the substrate portion with the support portion.

15. The heat dissipation device as described in claim 14, wherein the heat pipe comprises an evaporator in thermal engagement with one of the substrate portion and the) shell, and a condenser in thermal engagement with the support portion, one of the substrate portion and the shell has a channel defined therein, the support portion has a channel defined therein, the condenser is received in the channel of the support portion, and the evaporator is received in the channel of the substrate portion or the shell.

16. A heat dissipation device for cooling a memory card, comprising:
    a heat sink comprising a base member and a shell; and
    at least one heat pipe in thermal engagement with the heat sink;
        wherein the base member comprises a substrate portion, a support portion extending from the substrate portion, and a step portion formed at a joint of the support portion and the substrate portion, the support portion having a width larger than that of the substrate portion;
        wherein the shell is coupled to the support portion with a gap formed between the shell and the substrate portion, the shell is mounted on the step portion with the step portion sandwiched between the substrate portion and the shell to define the gap, and the gap is configured for receiving the memory card with the substrate portion and the shell abutting against opposite sides of the memory card; and
        wherein the at least one heat pipe connects one of the shell and the substrate portion with the support portion.

17. The heat dissipation device as described in claim 16, wherein the heat sink further comprises a plurality of pin fins extending from the support portion.

18. The heat dissipation device as described in claim 16, wherein the at least one heat pipe comprises an evaporator in thermal engagement with the substrate portion and a condenser in thermal engagement with the support portion; and the evaporator and the condenser are installed in the base member at different levels.

19. The heat dissipation device as described in claim 16, wherein the gap is defined in a lower portion of the heat sink; and a plurality of fins is formed on the support portion on an upper portion of the heat sink.

20. The heat dissipation device as described in claim 18, wherein the substrate portion has a channel defined therein, the support portion has a channel defined therein, the condenser is received in the channel of the support portion, and the evaporator is received in the channel of the) substrate portion.

* * * * *